United States Patent [19]

Brooks

[11] Patent Number: 5,615,234
[45] Date of Patent: Mar. 25, 1997

[54] DIGITAL HIGH-PASS FILTER HAVING BASELINE RESTORATION MEANS

[75] Inventor: James R. Brooks, Beaverton, Oreg.

[73] Assignee: SpaceLabs Medical, Inc., Redmond, Wash.

[21] Appl. No.: 246,185

[22] Filed: May 19, 1994

[51] Int. Cl.$^6$ .................................................. H04B 1/10
[52] U.S. Cl. ................ 375/350; 364/724.01; 333/165; 327/551; 327/559
[58] Field of Search ............................ 364/572, 724.01, 364/724.08; 375/350; 333/165, 166, 172, 174, 167, 176; 328/162, 168, 165, 167; 327/552, 553, 554, 555, 558–559, 564; 363/44

[56] References Cited

U.S. PATENT DOCUMENTS 4,125,812  11/1978  Polonio ................................. 328/162
4,237,424  12/1980  Weiner .................................. 328/175
5,303,173   4/1994  Mori et al. ......................... 364/724.19

*Primary Examiner*—Young T. Tse
*Assistant Examiner*—Bryan Webster
*Attorney, Agent, or Firm*—Seed and Berry LLP

[57] ABSTRACT

A digital high-pass filter derived from a digital low-pass filter of conventional design. The digital low-pass filter periodically calculates respective low-pass filter output values. Corresponding high-pass filter output values are then calculated by subtracting the low-pass filter output values from input samples provided by digitizing an input signal. The high-pass filter output values are then used to generate samples which are applied to a digital-to-analog converter for outputting a high-pass filtered replica of the input signal. The digital high-pass filter compensates for sudden, relatively large changes in the input signal by comparing the low-pass filter output value to the input sample and, in the event that there is a large discrepancy therebetween, setting the low-pass filter output value to the input sample before calculating the high-pass filter output value.

13 Claims, 4 Drawing Sheets

DIGITAL HIGH-PASS FILTER HAVING BASELINE RESTORATION MEANS

TECHNICAL FIELD

This invention relates to high-pass filters, and, more particularly, to a digital high-pass filter having means for restoring a filtered output signal to a zero volt baseline.

BACKGROUND OF THE INVENTION

In the field of electronics, a wide variety of filters are used to eliminate or select specific ranges or bands of frequencies. Low-pass filters are used to pass the spectral components of a signal that are below a cutoff frequency of the low-pass filter while attenuating spectral components that are above the cutoff frequency. Conversely, high-pass filters are used to pass the spectral components of a signal that are above a cutoff frequency while attenuating spectral components that are below the cutoff frequency. Band-pass filters are used to pass the spectral components of a signal falling within a predetermined range of frequencies while attenuating the frequency components above and below that range.

The most elementary low-pass and high-pass filters simply use a resistor connected in series with a capacitor. However, the current trend of implementing electronic devices using digital circuitry makes it less desirable to utilize these analog low-pass and high-pass filters. Therefore, various digital filtering techniques have been devised that can easily be implemented by properly programming a microprocessor that receives samples of the signal to be filtered. A digital low-pass filter can be easily derived by modeling the step response of an analog low-pass filter. Basically, the output of the low-pass filter changes by a magnitude equal to the exponential decay during the time between successive samples from the value of the prior output sample to the current input value. Although the step response of an analog low-pass filter can be easily modeled to provide a digital low-pass filter, it is substantially more difficult and processor intensive to implement a digital high-pass filter. In summary, while it has been relatively simple to implement a digital low-pass filter with modest processing requirements, it has not been heretofore possible to easily implement a digital high-pass filter without requiring substantially more processing power.

Another problem with digital high-pass filters results from baseline shift. In many field, such as medical electronics, a relatively low amplitude AC signal rides on a substantially greater DC voltage. In the event that only the AC is of interest, the signal is normally passed through a high-pass filter which then brings the AC signal down to a zero volt baseline. Thereafter, the AC signal can be greatly amplified. High-pass filters are capable of maintaining the AC signal on the baseline only if the rate at which the baseline shifts is relatively slow. If the baseline shifts at a sufficient rate that the spectral components of the shift are above the cutoff frequency of the high-pass filter, the shift will pass through the high-pass filter. Under these circumstances, the signal of the output of the high-pass filter will either saturate amplifiers downstream from the filter or cause a display of the AC waveform to extend beyond the visible bounds of the display.

SUMMARY OF THE INVENTION

It is an object of the invention to provide a digital high-pass filter that can be easily programmed using existing techniques for implementing digital low-pass filters.

It is another object of the invention to provide a digital high-pass filter that operates using relatively little processing power.

It is a further object of the invention to provide a digital high-pass filter that outputs a signal that can be easily restored to a zero volt baseline. These and other objects of the invention are provided by a fast response low-pass filter formed by first and second low-pass filters each of which receive a common input signal and output a respective output signal. The first filter has a relatively high cutoff frequency so that it accurately follows the input signal but fails to significantly attenuate tipple. The second filter has a cutoff frequency that is changed from a relatively low frequency to a relatively high frequency in response to a control signal. When the cutoff frequency of the second filter is relatively low it effectively attenuates tipple, although it may not always respond fast enough to accurately follow the input signal. When the cutoff frequency of the second filter is relatively high it, like the first filter, fails to significantly attenuate tripple, although it accurately follows the input signal. A comparator connected to the first and second filters compares the respective values of the first and second output signals to each other and generates the control signal when their difference exceeds a predetermined value. As a result, the fast response low-pass filter has a relatively low cutoff frequency to attenuate tipple until the input signal changes at a sufficient rate to cause the comparator to generate the control signal. The response time of the second filter then changes to the relatively high cutoff frequency so that it can accurately follow the input signal. The fast response low-pass filter may be implemented using either analog circuitry or digital filtering techniques.

Regardless of which technique is used, the comparator may generate the control signal to change the cutoff frequency from the relatively low frequency to the relatively high frequency when the difference between the first and second output signals is greater than a first predetermined value. Similarly, the comparator may terminate the control signal to change the cutoff frequency from the relatively high frequency to the relatively low frequency when the difference between the first and second output signals is within a second predetermined value. The first predetermined value may be greater than the second predetermined value to provide hysteresis to the changing of the cutoff frequency between the relatively high frequency and the relatively low frequency.

DETAILED DESCRIPTION OF THE INVENTION

Figure 1:
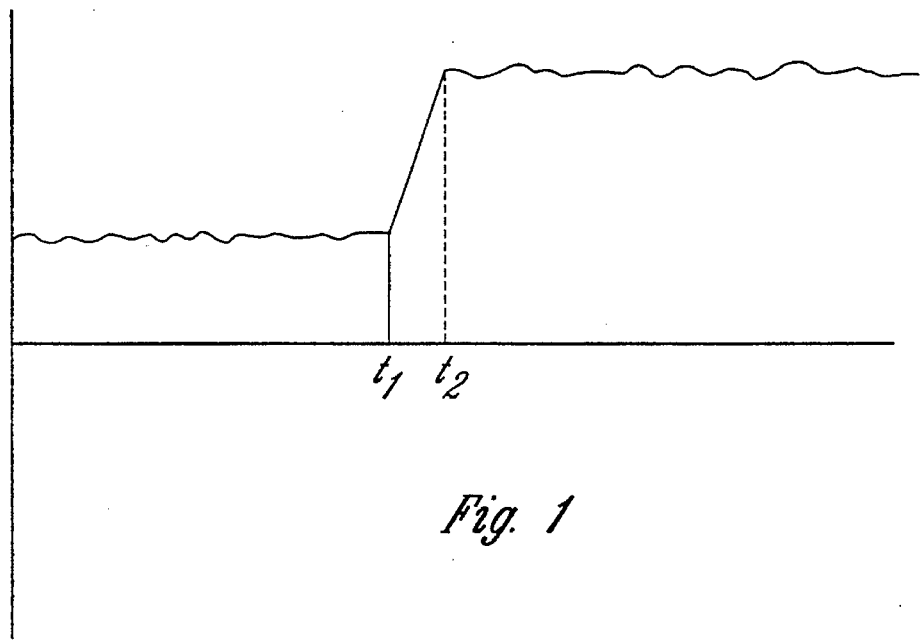
FIG. 1 is a waveform diagram of a signal that can be advantageously filtered with the inventive high-pass filter.

Although the inventive digital high-pass filter can advantageously be used to filter virtually any type of signal having both high-frequency and low-frequency spectral components, an example of a signal that can be advantageously filtered with the inventive filter is illustrated in FIG. 1. The signal is shown with a relatively low amplitude AC component riding on a substantially larger DC component, known as a "baseline". As shown in FIG. 1, the baseline initially drifts upwardly and then downwardly. The spectral components of this relatively slow drift can be well below the cutoff frequency of a high-pass filter that can be used to pass the AC components. However, at time $t_1$, the baseline undergoes a substantial and very rapid shift. The rapid nature of this shift causes it to have frequency components that would inherently be above the cutoff frequency of a high-pass filter that would be used to pass the AC components of the signal. While the shift occurring between $t_1$ and $t_2$ could be eliminated by using a high-pass filter having a higher cutoff frequency, a higher cutoff frequency would attenuate the AC components of interest that are riding on the baseline. After the shift from $t_1$-$t_2$, the baseline of the signal shown in FIG. 1 once again drifts slowly downwardly and then upwardly.

As mentioned above, in order to display the AC signal of interest it is usually necessary to bring the AC signal down to a zero volt baseline. Relocating the AC signal to a zero volt baseline allows the signal to be amplified so that the AC components are readily viewable in a visual display. If the signal was not brought down to a zero volt baseline, amplification of the signal to the extent that the AC signal was readily visible would cause it to be offset outside the viewing area of the visual display. The problem of baseline drift and shifting is fairly common in the field of medical instrumentation and it is caused by such phenomena as artifact.

Figure 2:
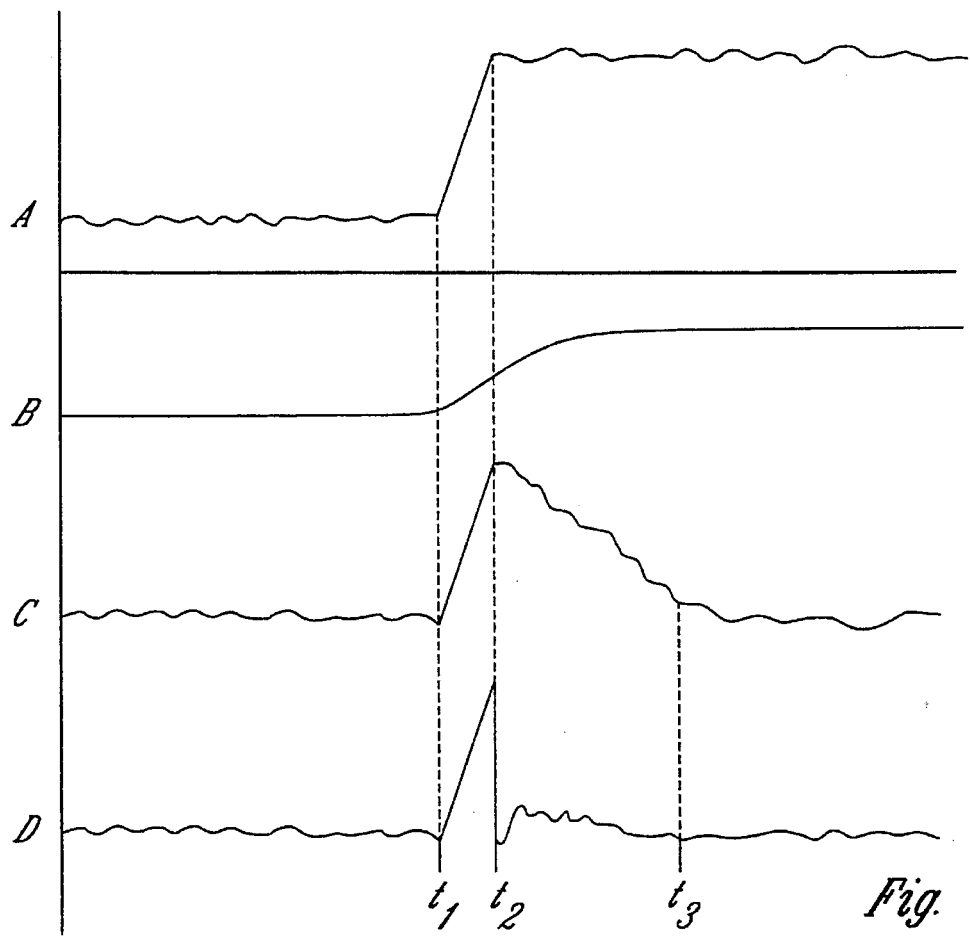
FIG. 2 is a waveform diagram showing the waveform of FIG. 1 along with low-pass filtered and high-pass filtered versions of the input waveform.

The response of a low-pass filter and a high-pass filter to the input signal of FIG. 1 is shown in FIG. 2. The input signal is shown as waveform A of FIG. 2. The waveform B of FIG. 2 shows the input signal after is has been filtered by a conventional low-pass filter. Note that the AC signal riding on the input is not present in the low-pass filtered output signal, but the rapid baseline shift occurring between times $t_1$ and $t_2$ has affected the output.

The waveform C shown in FIG. 2 is the output of a high-pass filter without a baseline restoration capability that has received the input waveform shown at the top of FIG. 2. Note that the AC signal is initially shown at a zero volt baseline. However, at time $t_1$, the baseline suddenly shifts in the same manner as the input waveform. Thereafter, the baseline of the signal output from the high-pass filter exponentially decays to zero volts with the AC component riding on the exponential decay. However, because of the magnitude of the baseline shift, the AC signal, after being amplified and coupled to a visual display, would not be visible until the baseline signal returned to substantially zero volts at about time $t_3$. The waveform D of FIG. 2 shows the output of the inventive high-pass filter which is the AC component of the input signal (waveform A) maintained at a zero volt baseline and immediately restored to a zero volt baseline at time $t_2$.

Figure 3A:
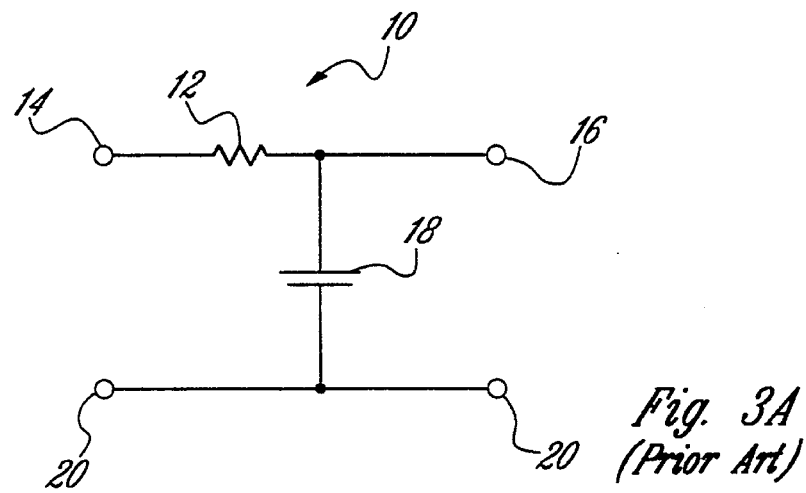
FIG. 3A is a schematic of a typical low-pass filter.

FIG. 3A shows a convention low-pass filter 10 consisting of a resistor 12 connected in series between an input terminal 14 and an output terminal 16, and a capacitor 18 connected between the output terminal 16 and a common ground terminal 20. As is well known in the art, the transfer function of the filter 10 is fairly constant up until a cutoff frequency of the filter, and it then declines at the rate of 20 dB per decade. The cutoff frequency $f_c$ is given by the formula:

$$f_c = \frac{1}{2\pi RC}$$

where R is the resistance of the resistor 12 and C is the capacitance of the capacitor 18.

Figure 3B:
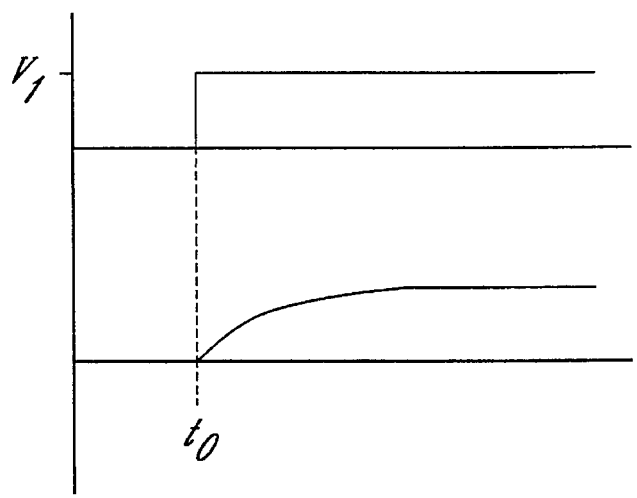
FIG. 3B is a waveform diagram showing the waveforms input to and output from the filter of FIG. 3A.

Viewed in the time domain, the filter responds to a voltage step applied to its input as shown in the waveforms of FIG. 3B. Specifically, at time $t_0$ the voltage applied between the input terminal 14 and the ground terminal 20 steps from 0 to $V_1$ volts, as shown in the upper waveform of FIG. 3B. The voltage $V_1$ gradually charges the capacitor through the resistor 12 so that the output voltage between the output terminal 16 and the ground terminal 20 gradually increases as shown in the lower waveform of FIG. 3B. The rate at which the output voltage responds to the voltage step applied to the input terminal 14 is a function of the time constant of the filter, which is equal to the product of the resistance of resistor 12 and the capacitance of capacitor 18. Mathematically, the time domain response of the filter is given by the formula:

$$V_0 = V_1(1 - 1^{-\frac{t}{RC}})$$

Figure 4:
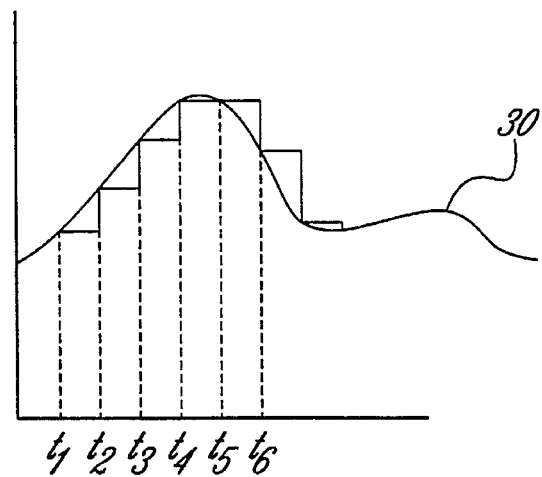
FIG. 4 is a waveform diagram showing the manner in which the sampling of a waveform approximates a series of voltage steps.

As illustrated in FIG. 4, an input waveform 30 is sampled at times $t_1, t_2, \ldots t_6$. After each sample is taken, the value of the sample remains constant until a next sample is taken. Each of the samples thus creates a step waveform in which the voltage changes from the prior sample voltage to the voltage of the input waveform 30 when the sample is taken. The response of a low-pass filter to each of the samples is given by the formula:

$$V_0 = V_c + [(1 - 1^{-\frac{t}{RC}})*(V_1 - V_c)]. \quad [1]$$

As mentioned above, the cutoff frequency $f_c$ of the filter 10 illustrated in FIG. 2 is given by the formula:

$$f_c = \frac{1}{2\pi RC} \quad [2]$$

where R is the resistance of the resistor 12 and C is the capacitance of the capacitor 18. This equation can be rearranged to:

$$RC = \frac{1}{2\pi F_c}. \quad [3]$$

Substituting equation [3] into equation [1] yields the equation:

$$V_o = V_c + [(1 - 1^{-2\pi f_c t})*(V_1 - V_c)]. \quad [4]$$

In a digitized system, the voltage $V_c$ is equal to $V_0$ from the previous sample. Sampling can also occur at a sufficient rate that the input voltage is essentially constant over the sample interval. Under these circumstances, the output voltage $V_{O_n}$ for sample n is given by the formula:

$$V_{O_n} = V_{O_{n-1}} + [(1 - 1^{-2\pi f_c t})*(V_{1_n} - V_{O_{n-1}})]. \quad [5]$$

The term $1-1^{-2\pi f_c t}$ can be represented by the constant K since the time constant of the filter is substantially longer than the interval between samples. It will be apparent to one skilled in the art that the term $1-1^{-2\pi f_c t}$ is an exponential increase from 0 to 1 as a function of time. For the limiting value of T equals 0, the constant K is equal to $1-1^{-0}$ which is equal to $1-1$ which is equal to 0. For the limiting value of T equals infinity, the constant K equals $1-1^{-\infty}$ which equals $$1 - \frac{1}{l^\infty}$$

which can be reduced to $$1 - \frac{1}{\infty}$$

which equals 1−0 which is equal to 1. Under these circumstances, the output $V_{0_n}$ can be given by the formula $V_{0_n} = V_{0_{n-1}} + KV_{1_n} - KV_{0_{n-1}}$. Since the constant K will be a fraction having a value of between 0 and 1 which can be a problem in calculating using floating point arithmetic in a real time digitized system, the above equation can be rearranged to the equation:

$$\left(\frac{1}{K}\right) V_{0_n} = \left(\frac{1}{K}\right)(V_{0_{n-1}} + KV_{1_n} - KV_{0_{n-1}}) \quad [6]$$

which can be rearranged as follows:

$$\left(\frac{V_{0_n}}{K}\right) = \left(\frac{V_{0_{n-1}}}{K} + V_{1_n} - V_{0_{n-1}}\right). \quad [7]$$

If the term $$\left(\frac{1}{K}\right) \left(\text{i.e., } \frac{1}{(1 - l^{-2\pi f_c t})}\right)$$

is defined as the term M, the above equation can be rewritten as:

$$MV_{0_n} = MV_{0_{n-1}} + V_{1_n} - V_{0_{n-1}}. \quad [8]$$

It will be apparent to one skilled in the art that the term M is an exponential decay from infinity to 1 as a function of time. For the limiting value of T equals 0, the term M is equal to $$\frac{1}{1 - l^{-0}}$$

which reduces to $$\frac{1}{1-1}$$

which is 1 divided by 0 or infinity. For the limiting value of T equals infinity, the term M is equal to $$\frac{1}{1 - l^{-\infty}}$$

which equals $$\frac{1}{1 - \frac{1}{l^\infty}}$$

which can further be reduced to $$\frac{1}{1 - \frac{1}{\infty}} \text{ and } \frac{1}{1-0},$$

which is equal to 1. It will also be apparent to one skilled in the art that an exponential decay from infinity to one and an exponential increase from zero to one are reciprocals of each other. If the term SUM is now defined as: SUM=$MV_0$, then $V_0$=SUM/M. Combining these equations yields:

$$SUM_n = SUM_{n-1} + V_{1_n} - V_{0_{n-1}}. \quad [9]$$

The variable SUM is thus the sum of the variable SUM from the prior sample and an incremental step equal to the difference between the current input to the filter and the output from the filter just prior to taking the current sample. The variable SUM is thus, in effect, the sum of all incremental steps that have previously occurred.

One the variable $SUM_n$ is calculated for each example, a corresponding low-pass filter output sample can then be calculated by the formula:

$$V_{0_n} = \frac{SUM_n}{M} \quad [10]$$

Figure 5:
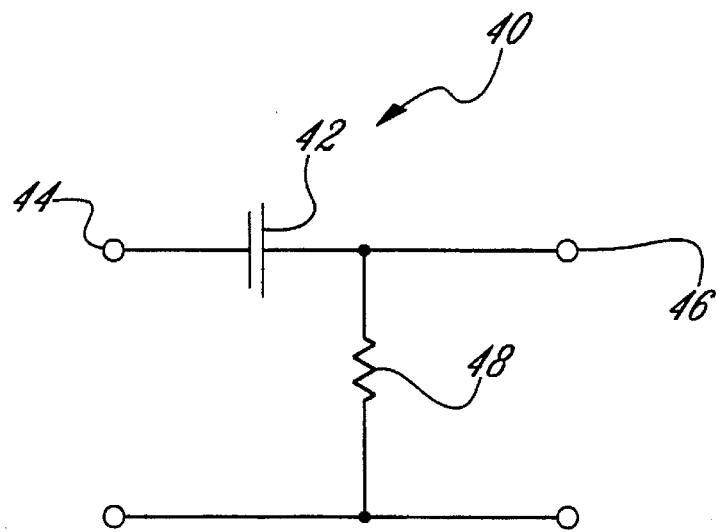
FIG. 5 is a schematic of a typical high-pass filter.

With reference to FIG. 5, a single high-pass filter 40 can be implemented with a capacitor 42 connected in series between an input terminal 44 and an output terminal 46, and a resistor 48 connected between the output terminal 46 and a common ground terminal 20.

With reference also to FIG. 3A, it will be apparent that, for any input signal applied to the filters 10, 40, the signal across the capacitors 18, 42, respectively, will be the low-pass filtered input signal. Also, the signal across the resistors 12, 48, respectively, will be the high-pass filtered input signal. The sum of the high-pass signal $V_H$ and the low-pass signal $V_L$ is equal to the input signal $V_1$, i.e., $V_1 = V_H + V_L$. This equation can be rearranged as follows:

$$V_H = V_1 - V_L \quad [11]$$

Equation 11 shows that the high-pass signal can be calculated simply by subtracting the low-pass signal from the input signal. As a result, a high-pass filter can be implemented by using a digital low-pass filter to obtain a low-pass signal, and then simply subtracting the low-pass signal from the input signal.

Assuming a sample rate of 1,000 samples per second, a low-pass filter can be implemented with a 10 Hz fast response filter and a 1 Hz low response ripple filter as follows: the value t in the above equations is given by $\frac{1}{1,000} = 0.001$. For the fast response filter, M is calculated as $$\frac{1}{(1 - l^{-2\pi f_c t})} = \frac{1}{(1 - l^{-2\pi * 10 * 0.001})} = 16.$$

M for the low response time ripple filter is calculated as $$\frac{1}{(1 - l^{-2\pi * 1 * 0.001})} = 160.$$

Figure 6:
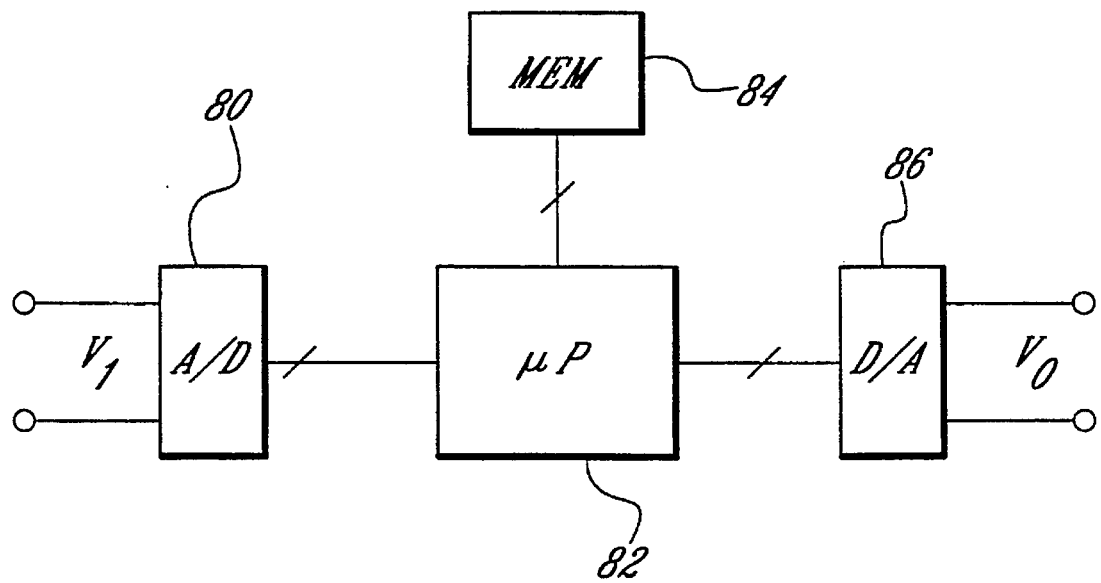
FIG. 6 is a block diagram of a presently preferred embodiment of the inventive high-pass filter.

The inventive fast response time, low-pass filter can also be implemented digitally as illustrated in FIG. 6. As illustrated in FIG. 6, the input signal is supplied to an analog-to-digital converter 80 which digitizes the input signal and applies it to a microprocessor 82. The operation of the microprocessor 82 is controlled by a set of instructions stored in memory 84. The memory 84 is also used for other purposes, as is conventional in the art. The microprocessor 82 calculates a value corresponding to the output of the filter and applies a corresponding byte to a digital-to-analog converter 86 which then outputs a voltage $V_0$. By choosing appropriate sample times for the analog-to-digital converter 80 and appropriate operating times for the digital-to-analog converter 86, the output voltage $V_{OUT}$ accurately follows the input voltage $V_{IN}$ without passing ripple present on the input signal $V_{IN}$.

Figure 7:
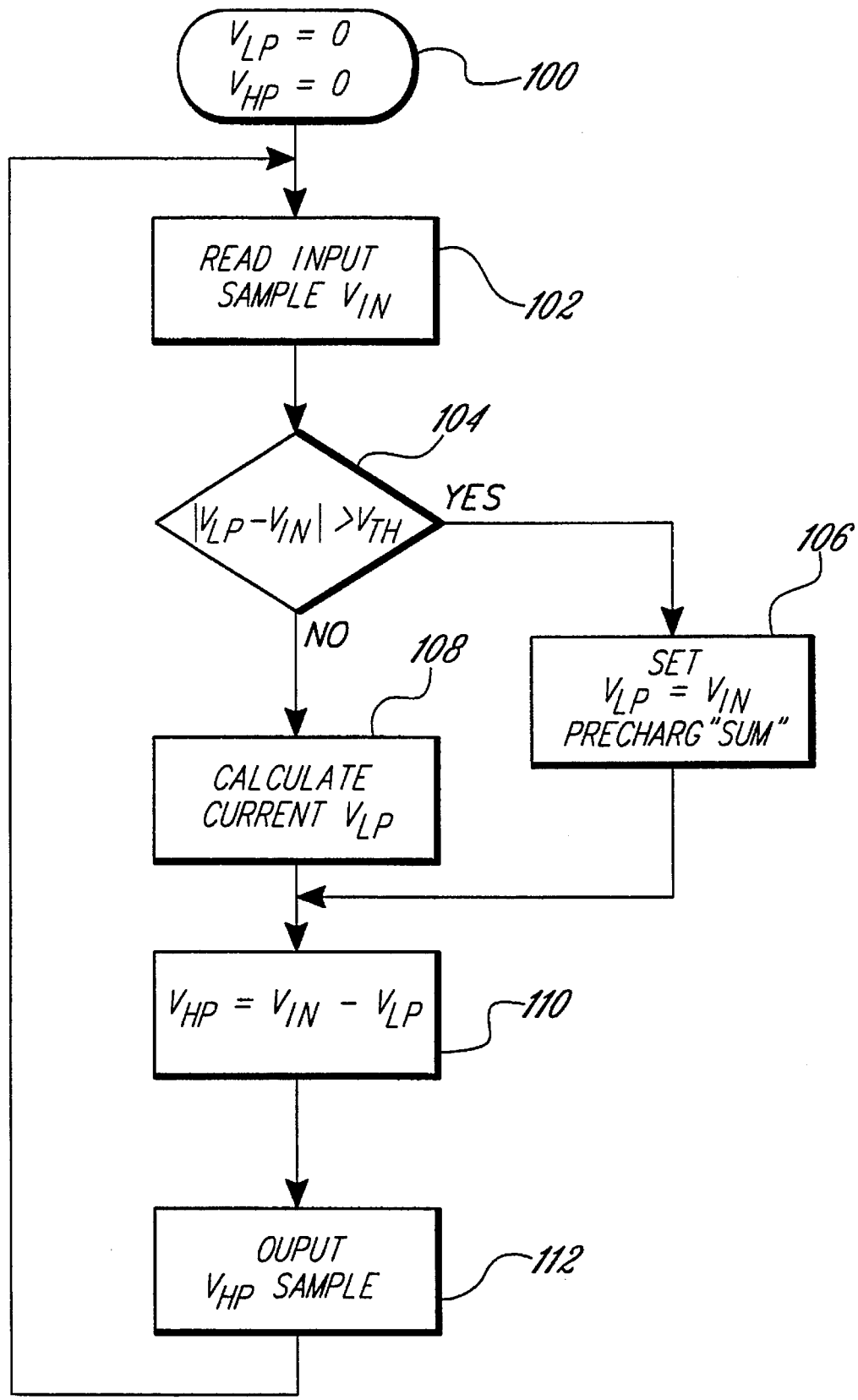
FIG. 7 is a flowchart of the software used to control a processor used in the embodiment of FIG. 6.

A flowchart of a program for controlling the operation of the microprocessor 82 is illustrated in FIG. 7. The program is entered at 100 where the current value of the low-pass filter voltage $V_{LP}$ is set to zero and the current value of the high-pass filter output $V_{HP}$ is set to zero. The program then reads a sample of the input voltage $V_{IN}$ from the analog to digital converter 80 (FIG. 6) at step 102. The input sample $V_{IN}$ is then compared to the current low-pass filter output value $V_{LP}$ at 104 by comparing the absolute value of $V_{HP}$ with a predetermined threshold $V_{TH}$. If the absolute value is greater than the threshold, the program branches to step 106, where the low-pass filter output value $V_{LP}$ is set to the current input sample $V_{IN}$, thereby "precharging" the variable SUM. If the low-pass filter output value $V_{LP}$ is fairly close to the input sample, the program instead branches to 108 where a new low-pass filter output value $V_{LP}$ is calculated using the formula explained above. In either case, the high-pass filter output value $V_{HP}$ is calculated at 110 by subtracting the low-pass filter output value $V_{LP}$ from the current input sample $V_{IN}$. The microprocessor 82 (FIG. 6) then outputs to the D/A converter 86 the high-pass output sample at step 112 before returning to 102 to once again read another input sample from the A/D converter 80. The D/A converter 86 then outputs a voltage corresponding to $V_{HP}$.

The high-pass digital filter illustrated in FIG. 6 can also be implemented using the program shown in Table 1 in the C-language.

TABLE 1

```
1   #define         m       16
2   #define         vth     25
3   int             sum
4   int             vhp
5   int             vin
6   int             vlp
7   void filter (void)
    {
8                   if(abs(V_hp) > V_Th)
                    {
9                           V_Lp = V_in;
10                          Sum = m * V_Lp;
                    }
11                  Sum = Sum + V_in - V_Lp;
12                  V_Lp = Sum/m;
13                  V_hp = V_in - V_Lp;
    }
```

The program defines the variable "m" as 16 in line 1 and, in line 2, it defines the threshold $V_{TH}$ which is the maximum allowed deviation of $V_{HP}$ from the zero volt baseline. Memory space is then reserved for the variables SUM, $V_{HP}$, $V_{IN}$, and VLP at lines 3–6, respectively. Line 7 is a void statement that serves as a program entry point and is called after each sample is taken. The program checks at line 8 to determine if the absolute value of the $V_{HP}$ is greater than the threshold $V_{TH}$. If the program determines at line 8 that the high-pass filter output $V_{HP}$ is within the threshold $V_{TH}$, the program branches to line 11 where the variable SUM is calculated according to Formula 9 on page 7. The variable SUM to the right of the "=" sign in line 11 is calculated from the value of SUM from the previous input voltage sample $V_{IN}$, and the variable SUM to the left of the "=" sign in line 11 is the new value of SUM. The program then calculates the low-pass filter output $V_{LP}$ at line 12 using Formula 10 on page 7. The high-pass filter output $V_{HP}$ is then calculated as the difference between the input voltage $V_{IN}$ and the low-pass filter output $V_{LP}$. As explained above, it is important that the low-pass filter be able to respond to substantial shifts in the baseline, and this is done by setting the low-pass filter output $V_{LP}$ to the input. The programs sets the low pass filter output $V_{LP}$ to the input voltage $V_{IN}$ at line 9 and precharges the variable SUM at line 10 by setting it equal to the product of M and $V_{LP}$. The program then performs the calculations at lines 11–13 as described above.

If the program determines at line 8 that the high-pass filter output $V_{HP}$ is outside the threshold $V_{TH}$, then the variable SUM is "precharged" to restore the baseline starting at line 9. After a high-pass filter output $V_{HP}$ sample is calculated as explained above, it is output by the microprocessor 82 (FIG. 6) to the digital-to-analog converter 86 which then outputs a corresponding voltage. At line 14, the program then calls the void filter statement of line 7 to loop through lines 8–13 and calculate a subsequent high-pass filter output $V_{HP}$ sample.

Instead of using the digital-to analog converter 86 to generate an analog output signal, the microprocessor 82 can directly drive a digital display (not shown) to display the numeric value of the high-pass filtered input signal or a graphic display (not shown) to plot the high-pass filtered value.

I claim:

1. A digital high-pass filter derived from a digital low-pass filter, comprising:

sample means for periodically sampling an input signal to provide a sequence of input samples;

first calculation means for calculating for each of said input samples a current low-pass filter sample corresponding to the sum of a low-pass filter sample for a previous input sample and a low-pass change value, said low-pass change value corresponding to the ratio between a current input sample less the low-pass filter sample for said previous input sample and a constant, said constant corresponding to an exponential decay from infinity to one with a predetermined time constant over a period of time corresponding to the elapsed time between said samples of said input signal; and second calculation means for calculating a current high-pass filter sample for each of said input samples, each of said high-pass filter samples corresponding to the difference between said current input sample and said current low-pass filter sample.

2. The digital high-pass filter of claim 1, further including baseline restoration means comprising means for setting said low-pass filter sample to the value of an input sample in the event that the absolute value of a high-pass filter sample is greater than a predetermined value whereby the output of said digital high-pass filter is reset in the event that its baseline shifts to said predetermined value.

3. The digital high-pass filter of claim 2 wherein said baseline restoration means comprise:

comparator means for comparing a low-pass filter sample with an input sample and generating a reset in the event that the absolute value of the difference between said low-pass filter sample and said input sample exceeds said predetermined value; and reset means for setting said low-pass filter sample to said input sample responsive to said reset.

4. A digital high-pass filter, comprising:

an analog-to-digital converter receiving an input signal applied to said input terminal, said analog-to-digital converter periodically digitizing said input signal to produce an input signal sample corresponding to said input signal;

processor means receiving each of said input samples, said processor means:

(a) calculating a change value corresponding to the magnitude of an exponential decay during a period between the taking of a prior input signal sample and the taking of a current input signal sample, said exponential decay being based on a time constant of said filter and the difference between a current input value and a prior intermediate output value;

(b) incrementing said prior intermediate output value by said change value to produce a current intermediate output value; and (c) subtracting said current intermediate output value from said current input value to provide a current filter output value; and converting each of said current filter output values to a corresponding voltage thereby generating an output signal for said digital high-pass filter.

5. The high-pass filter of claim 4, further including baseline restoration means for restoring the absolute value of said output signal to a relatively small value in the event that the absolute value of said output signal exceeds a predetermined value.

6. The high-pass filter of claim 5 wherein said baseline restoration means comprises:

means for comparing an intermediate output value to an input value and generating a reset if said intermediate output value differs from said input value by more than a predetermined magnitude; and setting said intermediate output value to said input value in response to said reset.

7. A method of high-pass filtering an input signal, comprising:

periodically sampling said input signal to provide a sequence of input samples;

calculating for each of said input samples a current intermediate value corresponding to the sum of said intermediate value for a previous input sample and an incremental change value, said incremental change value corresponding to the ratio between a current input sample less said intermediate value for said previous input sample and a constant, said constant corresponding to an exponential decay from infinity to one with a predetermined time constant over a period of time corresponding to the elapsed time between said the sampling of said input signal; and calculating a current output sample for each of said input samples, each of said current output samples corresponding to the difference between said current input sample and said current intermediate value.

8. The method of claim 7, further including the step of setting an intermediate value to the value of an input sample in the event that the absolute value of an output sample is greater than a predetermined value thereby restoring said output samples to within a predetermined range.

9. A method of high-pass filtering an input signal, comprising:

periodically digitizing said input signal to produce a plurality of input signal samples corresponding to said input signal;

calculating a change value corresponding to the magnitude of an exponential increase from zero to one during a period between the taking of a prior input signal sample and the taking of a current input signal sample, said exponential increase from zero to one being based on a time constant of said filter and the difference between a current input sample and a prior intermediate value;

incrementing said prior intermediate value by said change value to produce a current intermediate value; and subtracting a current intermediate value from said current input value to provide a current filter output value; and converting each of said current filter output values to a corresponding voltage thereby generating an output signal for a high-pass filter.

10. The method of claim 9, further including the step of restoring the absolute value of said output signal to a relatively small value in the event that the absolute value of said output signal exceeds a predetermined value.

11. A method of digitally high-pass filtering an input signal to produce filtered output signal samples, said method comprising:

(a) setting an intermediate sample to an initial value;

(b) sampling said input signal to generate an input signal sample corresponding to said input signal;

(c) calculating a change value corresponding to the magnitude of an exponential increase from zero to one during a period between the taking of a prior input signal sample and the taking of a current input signal sample based on a time constant of said digital bandpass filter and the difference between said current input signal sample and a prior intermediate sample;

(d) summing said change value with said prior intermediate sample to produce a current intermediate sample;

(e) subtracting said current intermediate sample from said current input signal sample to provide a filtered output signal sample; and (f) repeating steps (b)–(e).

12. The method of claim 11, further including the step of restoring the absolute value of said output signal samples to a relatively small value in the event that the absolute value of one of said output signal samples exceeds a predetermined value.

13. The method of claim 11, further including the step of:

comparing an intermediate sample to an input signal sample and generating a reset if said intermediate sample differs from said input signal sample by more than a predetermined magnitude; and setting said intermediate sample to said input signal sample in response to said reset.

* * * * *